United States Patent
Shaeffer (10) Patent No.: US 11,302,371 B2
(45) Date of Patent: Apr. 12, 2022

(54) MEMORY SYSTEMS AND METHODS FOR DIVIDING PHYSICAL MEMORY LOCATIONS INTO TEMPORAL MEMORY LOCATIONS

(71) Applicant: Rambus Inc., Sunnyvale, CA (US)

(72) Inventor: Ian Shaeffer, Los Gatos, CA (US)

(73) Assignee: Rambus Inc., San Jose, CA (US)

( * ) Notice: Subject to any disclaimer, the term of this patent is extended or adjusted under 35 U.S.C. 154(b) by 357 days.

(21) Appl. No.: 16/027,336

(22) Filed: Jul. 4, 2018

(65) Prior Publication Data

US 2019/0005997 A1 Jan. 3, 2019

Related U.S. Application Data (60) Continuation of application No. 14/194,923, filed on Mar. 3, 2014, now Pat. No. 10,043,560, which is a (Continued)

(51) Int. Cl.
*G06F 13/12* (2006.01)
*G11C 8/16* (2006.01)
(Continued)

(52) U.S. Cl.
CPC ............... *G11C 8/16* (2013.01); *G06F 12/00* (2013.01); *G06F 13/4018* (2013.01); *G06F 13/4243* (2013.01); *G11C 8/06* (2013.01)

(58) Field of Classification Search
CPC .. G06F 12/00; G06F 13/4243; G06F 13/4018; G11C 8/16; G11C 8/06
(Continued)

(56) References Cited

U.S. PATENT DOCUMENTS 5,559,969 A    9/1996   Jennings
5,906,003 A    5/1999   Runas
(Continued)

FOREIGN PATENT DOCUMENTS

WO    WO-2007-002324    1/2007

OTHER PUBLICATIONS

U.S. Appl. No. 60/693,631, Rajan, Suresh N.
(Continued)

*Primary Examiner* — Idriss N Alrobaye
*Assistant Examiner* — Brooke J Taylor
(74) *Attorney, Agent, or Firm* — Silicon Edge Law Group LLP; Arthur J. Behiel (57) ABSTRACT

Described are memory modules that support dynamic point-to-point extensibility using fixed-width memory die. The memory modules include data-width translators that allow the modules to vary the effective width of their external memory interfaces without varying the width of the internal memory interfaces extending between the translators and associated fixed-width dies. The data-width translators use a data-mask signal to selectively prevent memory accesses to subsets of physical addresses. This data masking divides the physical address locations into two or more temporal subsets of the physical address locations, effectively increasing the number of uniquely addressable locations in a given module. Reading temporal addresses in write order can introduce undesirable read latency. Some embodiments reorder read data to reduce this latency.

14 Claims, 8 Drawing Sheets

Related U.S. Application Data continuation of application No. 13/627,870, filed on Sep. 26, 2012, now Pat. No. 8,707,009, which is a continuation of application No. 13/282,184, filed on Oct. 26, 2011, now Pat. No. 8,281,055, which is a division of application No. 12/606,727, filed on Oct. 27, 2009, now Pat. No. 8,078,775, which is a division of application No. 11/292,407, filed on Nov. 30, 2005, now Pat. No. 7,610,417.

(51) Int. Cl.
   *G06F 13/40* (2006.01)
   *G06F 13/42* (2006.01)
   *G06F 12/00* (2006.01)
   *G11C 8/06* (2006.01)

(58) Field of Classification Search
   USPC .................................................. 710/62, 68
   See application file for complete search history.

(56) References Cited

U.S. PATENT DOCUMENTS

| | | | |
|---|---|---|---|
| 6,151,239 A | 11/2000 | Batra | |
| 6,502,161 B1 | 12/2002 | Perego et al. | |
| 6,563,751 B1* | 5/2003 | Wu | G11C 29/14 365/201 |
| 6,970,013 B1 | 11/2005 | Cory | |
| 7,272,675 B1 | 9/2007 | Paul et al. | |
| 7,480,756 B2 | 1/2009 | Kulkarni et al. | |
| 8,200,879 B1* | 6/2012 | Falik | G11C 5/02 710/307 |
| 2002/0023191 A1* | 2/2002 | Fudeyasu | G11C 7/1051 711/104 |
| 2003/0061460 A1 | 3/2003 | Barth et al. | |
| 2003/0126338 A1* | 7/2003 | Dodd | G06F 13/4086 710/305 |
| 2003/0172243 A1 | 9/2003 | Ripley | |
| 2003/0182519 A1 | 9/2003 | Riesenman | |
| 2004/0019756 A1* | 1/2004 | Perego | G11C 7/1045 711/170 |
| 2004/0044870 A1 | 3/2004 | Pawlowski | |
| 2004/0054845 A1 | 3/2004 | Ware et al. | |
| 2004/0139253 A1* | 7/2004 | Perego | G06F 13/1684 710/71 |
| 2004/0186956 A1 | 9/2004 | Perego et al. | |
| 2005/0015558 A1* | 1/2005 | Evans | G11C 7/1009 711/154 |
| 2005/0066133 A1* | 3/2005 | Rao | G11C 11/4093 711/149 |
| 2005/0177691 A1* | 8/2005 | Kimelman | G06F 12/04 711/155 |
| 2005/0278495 A1 | 12/2005 | Lee | |
| 2006/0136618 A1 | 6/2006 | Gower et al. | |
| 2007/0003063 A1 | 1/2007 | Smith et al. | |

OTHER PUBLICATIONS

"FB-DIMM" Fully-Buffered DIMM dated Jul. 4, 2005, Memory Module Manufactures. 3pages.

"Introducing FB-DIMM Memory: Birth of Serial RAM?" dated Aug. 24, 2005 Downloaded from http://www.pcstats.com/articleview.cfm?articleid=1812&page=3. 6 pages.

Foreign Priority Document, 03104176.7, pp. 1-32, May 26, 2005. 32 Pages.

JEDEC Standard, "DDR2 SDRAM Specification," JESD-2B, Revision of JESD79-2A, JEDEC Solid State Technology Association, Jan. 2005. 112 pages.

John, Lizy Kurian, "VaWiRAM: A Variable Width Random Access Memory Module," 1995 IEEE, 9th International Conference on VLSI Design-1996. pp. 219-224. 6 pages.

Rambus Inc., "Dynamic Point-to-Point Technology." found online at http://www.rambus.com/products/innovationslicensing/innovations/dpp.asp, dated Mar. 11, 2011, downloaded Oct. 12, 2005. 2 pages.

Vogt, Pete. "Fully Buffered DIMM (FB-DIMM) Server Memory Architecture: Capacity, Performance, Reliability, and Longevity", dated Feb. 18, 2004. 33 pages.

* cited by examiner

MEMORY SYSTEMS AND METHODS FOR DIVIDING PHYSICAL MEMORY LOCATIONS INTO TEMPORAL MEMORY LOCATIONS

FIELD OF THE INVENTION

The present invention relates generally to the field of communications, and more particularly to high speed electronic signaling within and between integrated circuit devices.

BACKGROUND

Manufacturers and designers of integrated circuit devices, such as memory controllers or processors, continue to increase the amount of signals that these integrated circuit devices can transmit and/or receive over a period of time (bandwidth). For example, processors having multiple cores have enabled, at least in part, increased processor bandwidth that may be used in communicating with integrated circuit memory devices. Some have predicted that processor bandwidth will double every three years for the next ten years.

However, some do not believe that integrated circuit memory devices will be able to increase their bandwidth to match the perceived increases in processor bandwidth. The operating times of integrated circuit memory device cells or transistors, such as a dynamic random access memory (DRAM) cells, may not increase fast enough to meet future processor bandwidths. DRAM cell density may also not increase fast enough. Some have predicted that annual increases in memory cell density will be significantly reduced. Thus, there is a need for memory system topologies having a high bandwidth that can keep pace with increases in processor bandwidth.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Dynamic point-to-point (DPP) technology may combine the benefits of both point-to-point and multi-drop bus interconnect topologies, allowing the creation of memory systems using point-to-point signaling with the flexibility to add memory capacity through module upgrades. By providing capacity expansion, DPP technology allows point-to-point upgrades at full memory system bandwidth. DPP technology can be applied to many different types of memory technologies, including both static and dynamic random-access memories (SRAM and DRAM, respectively). Exemplary memory systems include Rambus XDR™ DRAM and both single and double data-rate synchronous DRAM (SDRAM).

DPP technology relies upon variable-width memory dies to facilitate expansion. A memory system supporting a single 32-bit module might be expanded to two modules by "dynamically rewiring" the 32-bit module to become a 16-bit module when a second module is added. In the resulting two-module system, each of two 16-bit modules supplies half of the memory bandwidth across a different half of the memory datapath in a point-to-point topology. Memory modules that support DPP functionality change the width of the memory devices on the modules.

Many memory technologies are of the fixed-width variety, and thus may be incompatible with DPP extensibility. This limitation means that the bulk of available, standard memory dies do not support DPP extensibility. Detailed below are variable-width memory modules that adapt fixed-width memory dies or technologies for use in DPP memory systems.

Memory modules in accordance with some embodiments include configurable data-width translators that can be set to translate data of various widths into data suitable for the fixed-width memory die. The data-width translators in accordance with some embodiments use a data-mask signal to selectively prevent memory accesses to subsets of physical addresses. This data masking divides physical address locations of the memory die into two or more temporal subsets of the physical address locations, effectively increasing the number of uniquely addressable locations in a given memory die. As used herein, the term "width" refers to the number of bits employed to represent data.

Figure 1A:
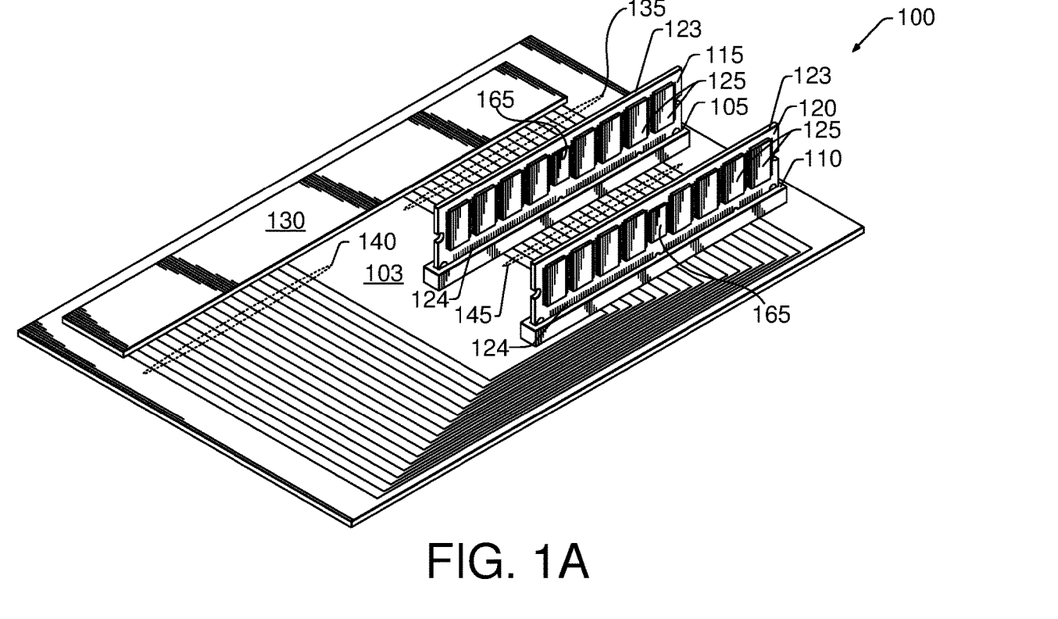
FIGS. 1A and 1B respectively depict dual- and single-module embodiments of a memory system 100 that supports dynamic point-to-point extensibility using fixed-width memory die.
Figure 1B:
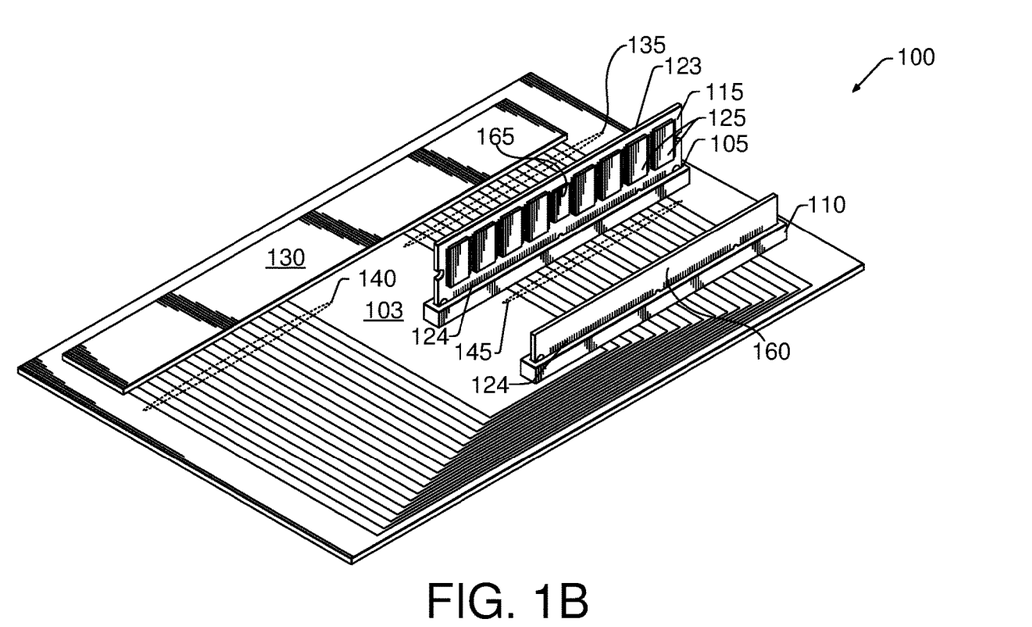

FIGS. 1A and 1B respectively depict dual- and single-module embodiments of a memory system 100 that supports dynamic point-to-point extensibility using fixed-width memory die. System 100 resides on a computer motherboard 103 and is actually a subsystem of the motherboard. System 100 includes a memory controller 130 and two electrical receptacles or connectors 105 and 110, each of which accepts a respective one of installable/removable memory modules 115 and 120. Each of memory modules 115 and 120 includes a module backplane 123, rows of electrical contacts (module pins) 124 along opposite surfaces of the respective backplane 123, and a plurality of fixed-width memory devices 125, typically packaged as discrete integrated circuits (ICs). Memory devices 125 may be some type of read/write memory, such as DRAMs, SRAMs, SDRAMs, Flash RAM, or read-only memories (ROMs). Though not shown, memory controller 130 may have an interface that communicates with other components on the motherboard, allowing those components to read from and write to memory.

A plurality of signal lines, or "traces," extends between memory controller 130 and electrical connectors 105 and 110 for electrical communication with memory modules 115 and 120. More specifically, a first set of signal lines 135 extends to first electrical connector 105, a second set of signal lines 140 extends to second electrical connector 110, and a third set of signal lines 145 extends between connectors 105 and 110. In a dual-module configuration (FIG. 1A), controller 130 communicates with module 115 via lines 135 and with module 120 via lines 140: the third set of signal lines 145 is not used. In the single-module configuration (FIG. 1B), a shorting module 160 is inserted into connector 110 in lieu of memory module 120. Module 160 connects signal lines 140 with signal lines 145. The two sets of signal lines 135 and 140 from controller 130 are then used collectively to communicate with the one module 115. Twice as many data lines are thus made available to module 115 in the single-module configuration. In other embodiments, shorting module 160 is omitted in favor of some other means of interconnecting signal lines 140 and 145.

Memory modules 105 and 110 each include a data-width translator 165 that allows modules 115 and 120 to vary the effective width of their external memory interfaces without varying the width of the internal memory interfaces (not shown) extending between the translators 165 and associated fixed-width dies 115. Memory system 100 thus supports single and dual-module point-to-point memory configurations that each make use of both sets of lines 135 and 140 from controller 130.

The terms "external" and "internal" are defined with respect to the modules, with the external interfaces conveying information to and from the modules and the internal interfaces conveying information between ICs on a given module. While FIGS. 1A and 1B show modules in which one data-width translator 165 supports all of dies 125 for a given module, multiple, smaller buffers may support individual dies or subsets of dies in other embodiments. Modules 115 and 120 may be adapted to automatically sense the presence or absence of a second module and configure the appropriate data width accordingly. Memory modules provided with fixed-width memory die can thus provide the extensibility of a multi-drop system while retaining the performance advantages of a point-to-point topology.

Figure 2:
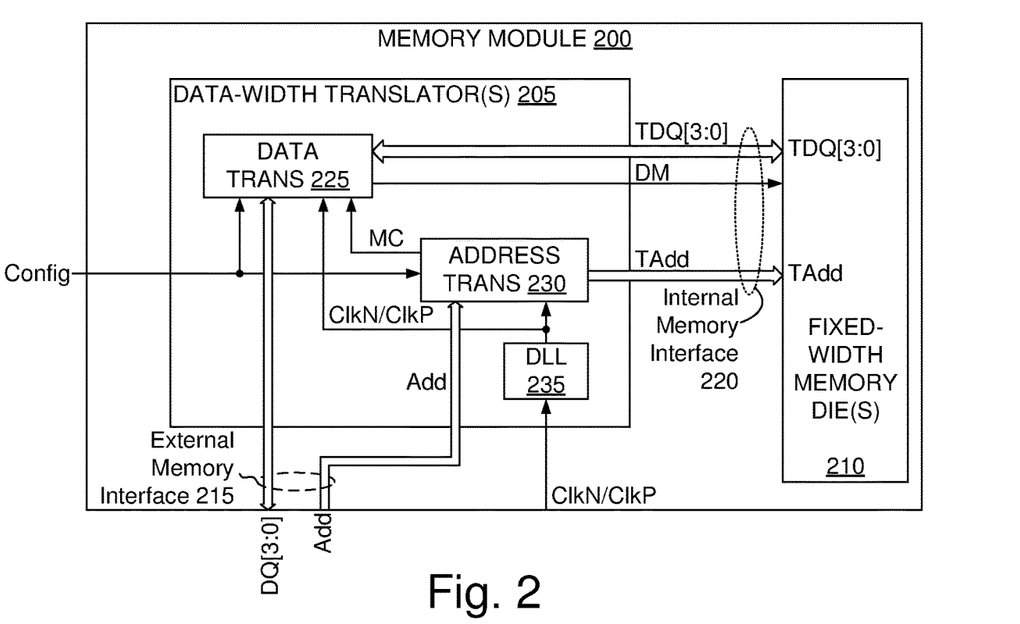
FIG. 2 schematically depicts a variable-width memory module 200, in accordance with one embodiment, that includes a data-width translator 205 coupled to one or more fixed-width memory die 210.

FIG. 2 schematically depicts a variable-width memory module 200, in accordance with one embodiment, that includes a data-width translator 205 coupled to one or more fixed-width memory die 210. Memory module 200 includes external data and address ports DQ[3:0] and Add communicating like-named signals with data-width translator 205 via an external memory interface 215. Memory die 210 includes internal data and address ports TDQ[3:0] and TAdd communicating like-named signals with data-width translator 205 via an internal memory interface 220. Data ports DQ[3:0] and TDQ[3:0] are each four-bits wide in this simple illustration, but the actual bus width can have more or fewer bits. In accordance with this embodiment, translator 205 can translate data of width one, two, or four on port DQ[3:0] into four-bit-wide data on port TDQ[3:0]. This flexibility allows one or a combination of modules 200 to be used in an extensible point-to-point memory topology. As used herein, a "port" is a physical serial or parallel interface over which related information is sent or received. As detailed below, each variable-width module is characterized in that the effective width of the external memory interface 215 can be varied to provide ports of various data widths.

Data-width translator 205 includes a data translator 225, an address translator 230, and a delay-locked loop (DLL) 235. DLL 235 conventionally produces an internal differential clock signal ClkN/ClkP locked to a like-identified incoming differential clock signal ClkN/ClkP, typically from an associated memory controller or a clock-generator device. Though not shown, memory 210 may receive the same or a similar clock signal from translator 205 or the memory controller. Data translator 225 and address translator 230, responsive to a configuration signal Config, translate the data on one, two, or four of data lines DQ[3:0] into four-bit-wide data on lines TDQ[3:0] for write cycles; and conversely translate four-bit-wide data on lines TDQ[3:0] into one, two, or four-bit-wide data on one or more of external data lines DQ[3:0] for read cycles. In one embodiment, plugging a second memory module into a two-connector mother board automatically asserts configuration signal Config, causing each of two memory modules to configure themselves as half-width (e.g., two bits instead of four) modules. In other embodiments, configuration signal Config comes from a register on memory module 200 (e.g., within data-width translator 205) that is addressable by the memory controller and is set, such as via the BIOS, at boot time. In general, external memory interface 215 conveys data signals of data-width N, internal memory interface 220 conveys signals of data-width M, and configuration signal Config is indicative of the ratio of N to M. Some embodiments use a phase-locked loop (PLL) instead of DLL 235.

Fixed-width memory die may include a mask line or pin that can be used in support of partial-write operations. For example, double data rate "DDR" memory die include a data-mask pin DM and single data rate "SDR" memory die include a data-mask pin DQM. Memory modules detailed herein may employ data-mask functionality to create variable-width modules using fixed-width memory die. In the example of FIG. 2, a data-mask line DM extends from data translator 225 to memory 210.

Figure 3:
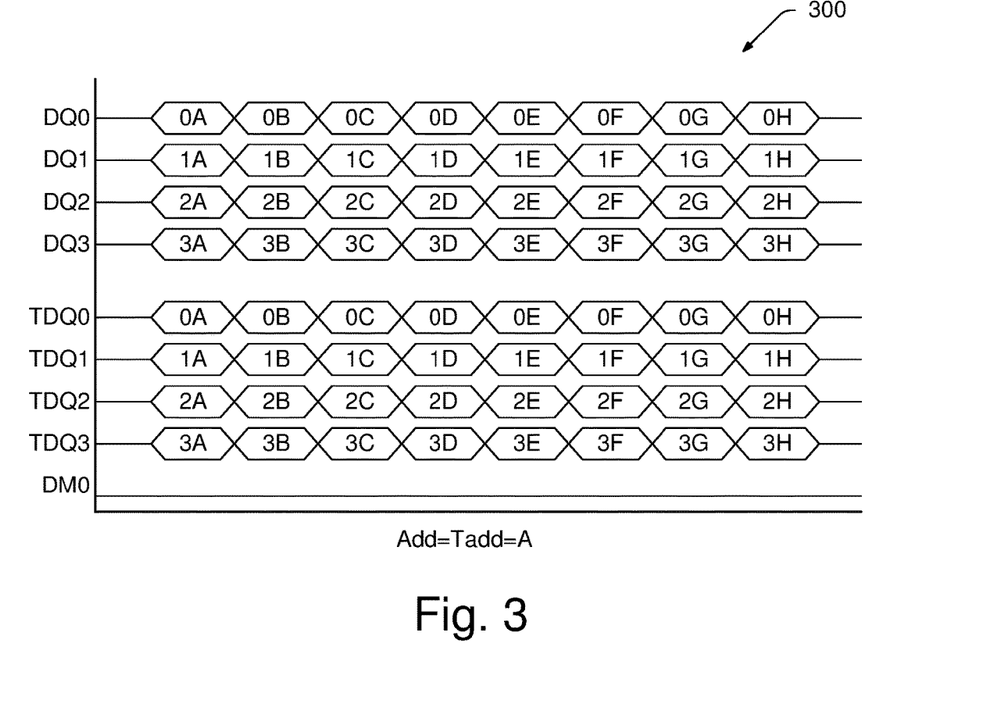
FIG. 3 is a waveform diagram depicting the operation of module 200 of FIG. 2 in a single-module memory topology in which data to be written to a common address A is transmitted over external lines DQ[3:0] as four eight-symbol bursts.

FIG. 3 is a waveform diagram 300 depicting the operation of module 200 of FIG. 2 in a single-module memory topology in which data to be written to a common address A is transmitted over external lines DQ[3:0] as four eight-symbol bursts. For example, line DQ0 conveys eight binary symbols 0A through 0H for storage at physical address location A in fixed-width memory 210. The three remaining external data lines DQ[3:1] likewise convey eight symbols each for storage at address location A. The total number of symbols to be stored at a given address A is therefore thirty-two (four times eight) in this example. Translator 205 conveys the thirty-two symbols and corresponding address A to memory 210 via the four internal data lines TDQ[3:0] and internal address lines TAdd. In this instance memory module 200 functions in the manner of a fixed-width module, and mask signal DM is not asserted. The external and internal data ports are of the same width and operate at the same clock rate, so the data rates of the internal and external interfaces are equal.

Figure 4:
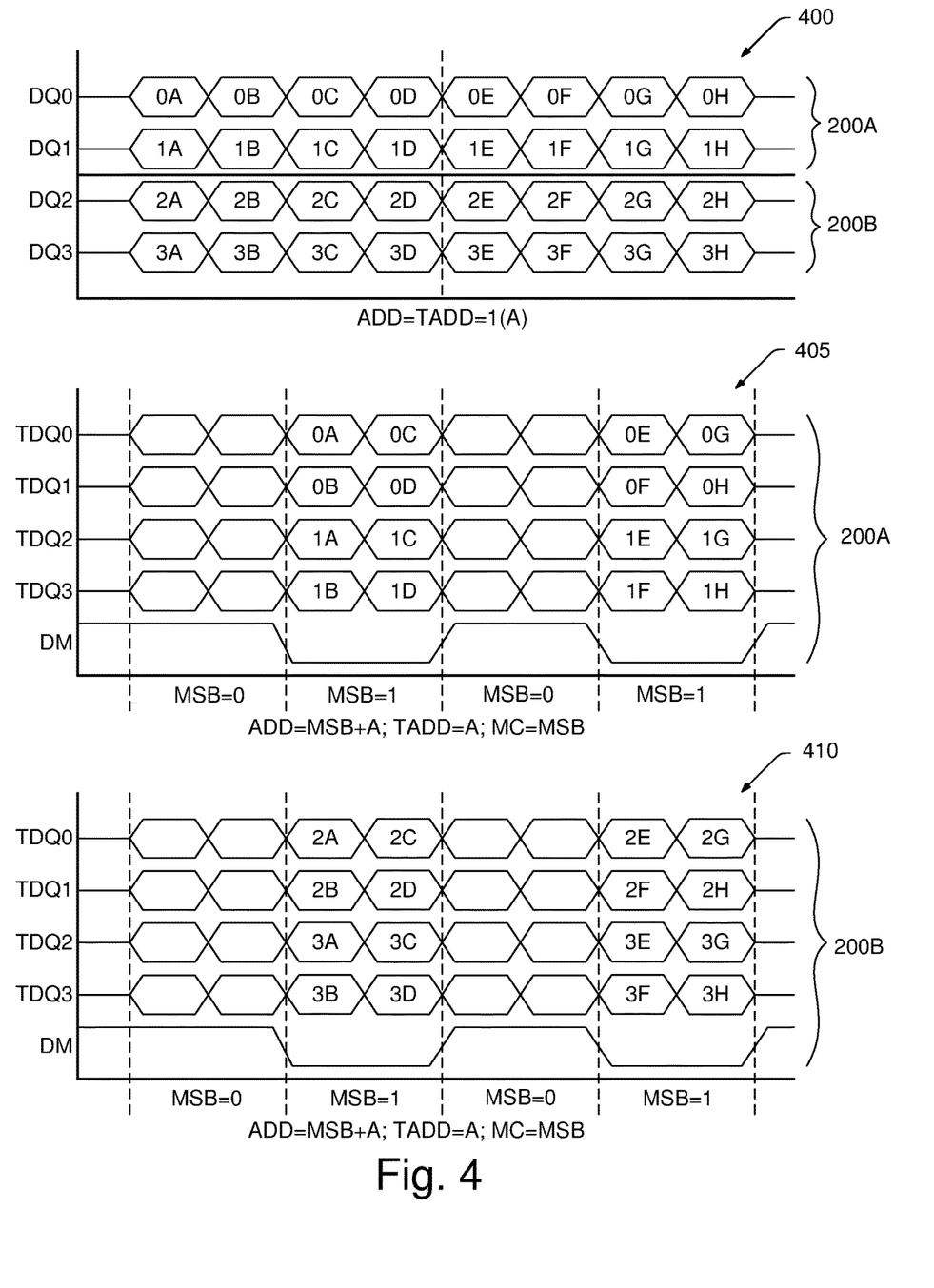
FIG. 4 depicts three waveform diagrams 400, 405, and 410 depicting the operation of a pair of modules 200A and 200B in a dual-module memory topology of the type detailed in FIGS. 1 and 2.

FIG. 4 depicts three waveform diagrams 400, 405, and 410 depicting the operation of a two-module memory topology in accordance with one embodiment. Waveform diagrams 405 and 410 correspond to a respective pair of modules 200A and 200B, each of which is similar or identical to module 200 of FIG. 2. Modules 200A and 200B function together in the manner depicted in FIG. 1A to double the memory capacity as compared with a single-module topology. An additional address bit, the most-significant bit (MSB) in this example, is included to double the number of address locations that can be specified. Address bus Add has sufficient lines to accommodate the maximum required number of address lines. In the example of FIG. 4, the address specified for the depicted collection of data symbols is address A of FIG. 3 plus a logic one MSB (i.e., Add=1:A).

In general, the required number of address bits depends in part on the data width of the modules. All else being equal, a module of width four requires one fewer address bit than a module of width two, and two fewer address bits than a module of width one. Thus, if a memory controller behaves as if it is accessing a module of width two, for example, to access die of width four, the controller will send one address bit more than is needed for the die. Modules in accordance with some embodiments use the extra address bit to address data in the time domain.

When both modules 200A and 200B are inserted in the manner detailed in connection with FIG. 1A, each is coupled to half of the external data lines. With reference to waveform 400, the first two external data lines DQ[1:0] are coupled to the first module 200A and the remaining two lines DQ[3:2] are coupled to the second module 200B. Each module includes one or more four-bit-wide memory die, so incoming data of width two (e.g., DQ[1:0]) are translated to data of width four on the internal bus TDQ[3:0] of the respective module. In another embodiment, pins DQ[1:0] on the controller connect to pins DQ[1:0] on the first module, pins DQ[3:2] on the controller connect to pins DQ[1:0] on the second module, and pins DQ[3:2] on the first module connect to pins DQ[3:2] on the second module.

Diagram 405 depicts the results of the translation carried out by data translator 225 and address translator 230 of module 200A. In this example, the first two symbols on each of lines DQ0 and DQ1 are translated from serial to parallel and the four translated symbols are provided simultaneously on lines TDQ[3:0] over one clock cycle. The third and fourth symbols on each of lines DQ0 and DQ1 are then similarly translated and provided simultaneously on lines TDQ[3:0] over the next clock cycle.

The address specified for the write over internal bus TDQ[3:0] is address A, just as in the example of FIG. 3. However, data-width translator 205 uses mask signal DM to divide the addressed physical locations in fixed-width memory 210 into subsets of memory locations addressed separately in the time domain, a process that may be referred to as "time slicing." In this example in which the address MSB=1, data translator 225 asserts mask signal DM (DM=1) during the timeslice labeled MSB=0 to block writes to the first set of eight locations having address A, and then de-asserts mask signal DM (DM=0) during the timeslice labeled MSB=1 to allow writes to the second set of eight locations having address A. This process repeats for the third and forth sets of eight symbols and the corresponding storage locations of address A.

As may be seen in diagram 405, the asserted data mask signal DM prevents writes to half of the addressed storage locations in module 200A. These storage locations may be accessed using address A extended to include an MSB of zero. The number of uniquely addressable locations in module 200A is thus doubled by dividing the physical address locations into two or more temporal subsets of the physical address locations.

In diagram 405, the most significant bit (MSB) of the address designates the temporal subsets of memory locations in this two-module embodiment. In practice, the extra address bit can be any bit, and not just the most significant one. Furthermore, additional bits can be included where needed to separately access more than two temporal subsets of memory locations.

Address translator 230 presents all but one of the externally supplied address bits (e.g., all but the MSB) to memory 210 over address bus TAdd. The MSB is presented to data translator 225 as memory control bit MC. Data translator 205 then asserts mask signal DM during time slot MSB=0 or MSB=1 depending upon the state of memory control bit MC, masking the data write to half of the address space in the address specified over address bus TAdd. The active portion of the external data port is half the width of the internal data port, and the internal and external memory interfaces operate at the same clock rate. The internal and external data rates remain equal, however, because only half of the available time slots are used to convey data over the internal data port. Embodiments of the invention thus preserve the data rate between the internal and external memory interfaces.

Diagram 410 depicts the results of the translation carried out by data translator 225 of module 200B. As in the example of module 200A and diagram 405, half of the addressed physical memory locations are written to the memory in module 200B. The number of addressable storage locations is double that of the single-module topology because each physical address location in each fixed memory die is divided into two independently addressable time slots. The operation of module 200B is the same as detailed above in connection with diagram 405 and module 200A except that stored data is from data lines DQ[3:2]: a detailed discussion of waveform diagram 410 is therefore omitted for brevity.

Figure 5:
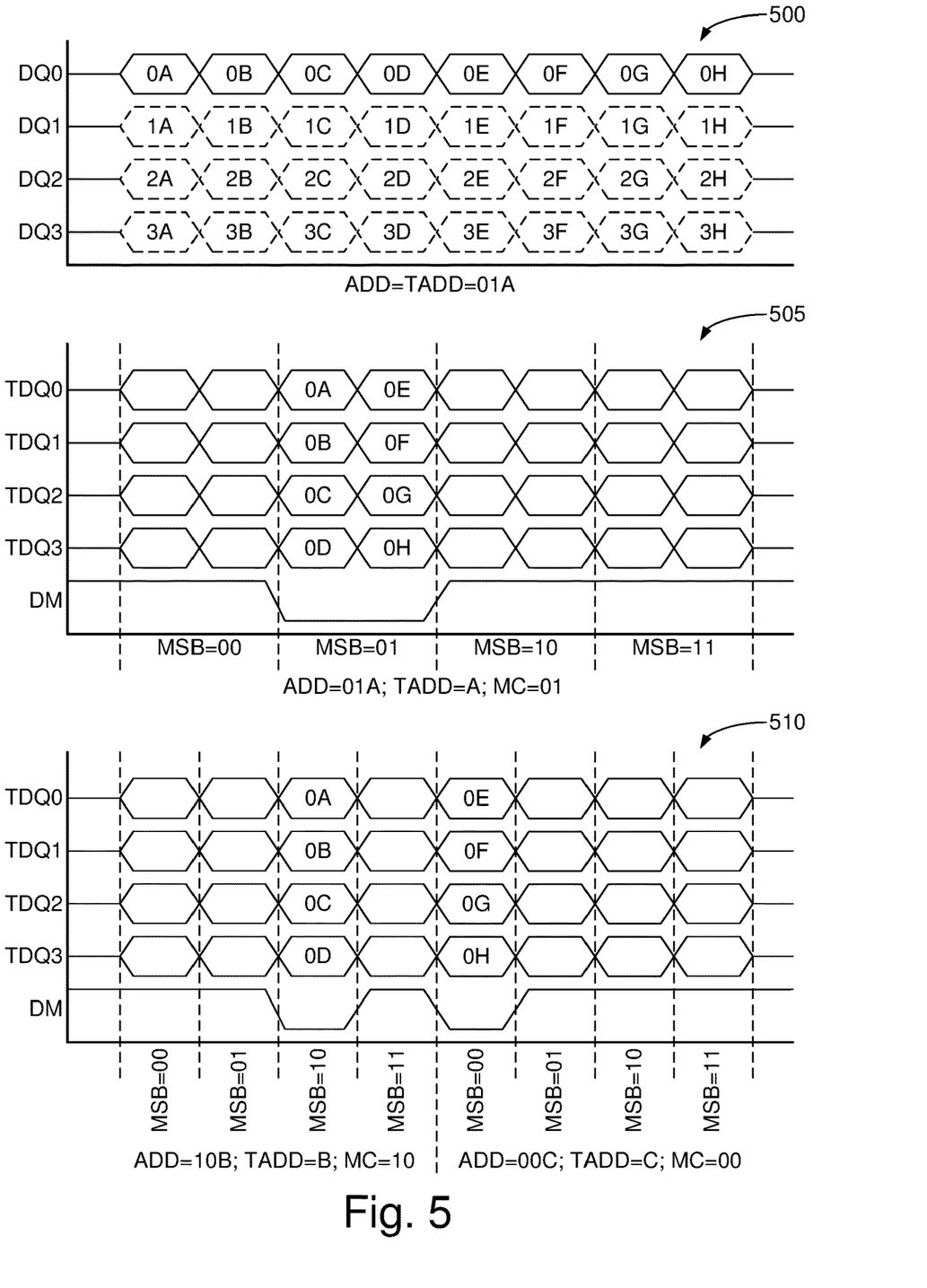
FIG. 5 includes three waveform diagrams 500, 505, and 510 illustrating the operation of alternative four-module topologies.

FIG. 5 includes three waveform diagrams 500, 505, and 510 illustrating the operation of alternative four-module topologies. Diagram 500 represents a four-bit external memory interface with lines DQ[3:0]. Each of the examples of diagrams 505 and 510 shows the behavior of one of four modules, each of width one, receiving data on external data line DQ0 addressed to address 01A. The address has been extended by two bits to uniquely identify quadruple the subsets of memory locations as compared with a single-module embodiment.

Diagram 505 details the behavior of one of four bit-wide modules similar or identical to module 200 of FIG. 2. The data burst length is eight symbols in this example. The address presented on the external address bus Add is assumed to be 01A for each of four two-symbol time slots MSB=00 through MSB=11, where MSB stands for the two most significant address bits. Address translator 230 presents the two MSBs (01 in this example) to data translator 225 as memory control bits MC, and presents the remaining lower-order address bits (A in this example) to memory 210 over address bus TAdd. Data translator 205 logically combines control bits MC to assert mask signal DM during three of the four time slots, allowing a write to occur only in time slot MSB=01. Only one fourth of the physically addressed memory locations are written to, with the remaining locations being masked by signal DM. Data-width translator 205 thus divides the fixed-width memory space sharing a common physical address into four address spaces separately addressable in the time domain. The external data port is one-fourth the width of the internal data port in this configuration, but the internal and external data rates remain equal because three-fourths of the available time slots are masked.

Diagram 510 details the behavior of one of four bit-wide modules in an embodiment of module 200 of FIG. 2 in which the data burst length is four symbols. The address ADD is here assumed to be 10B for the first four symbols, where address bits B designate a physical address location and the remaining two bits 10 designate one of four temporal subsets of address locations within the designated physical address location B. Address translator 230 presents address bits B to memory 210 over address bus TAdd, and presents the temporal address bits (e.g., 10) to data translator 225 as memory control bits MC. Data translator 205 logically combines control bits MC to assert mask signal DM during three of the four time slots MSB=00 through MSB=11, only allowing a write to time slot MSB=10 in this case. The process repeats for the next burst of data, this one directed to address 00C, which corresponds to the first of four time slots associated with physical address location C.

Figure 6:
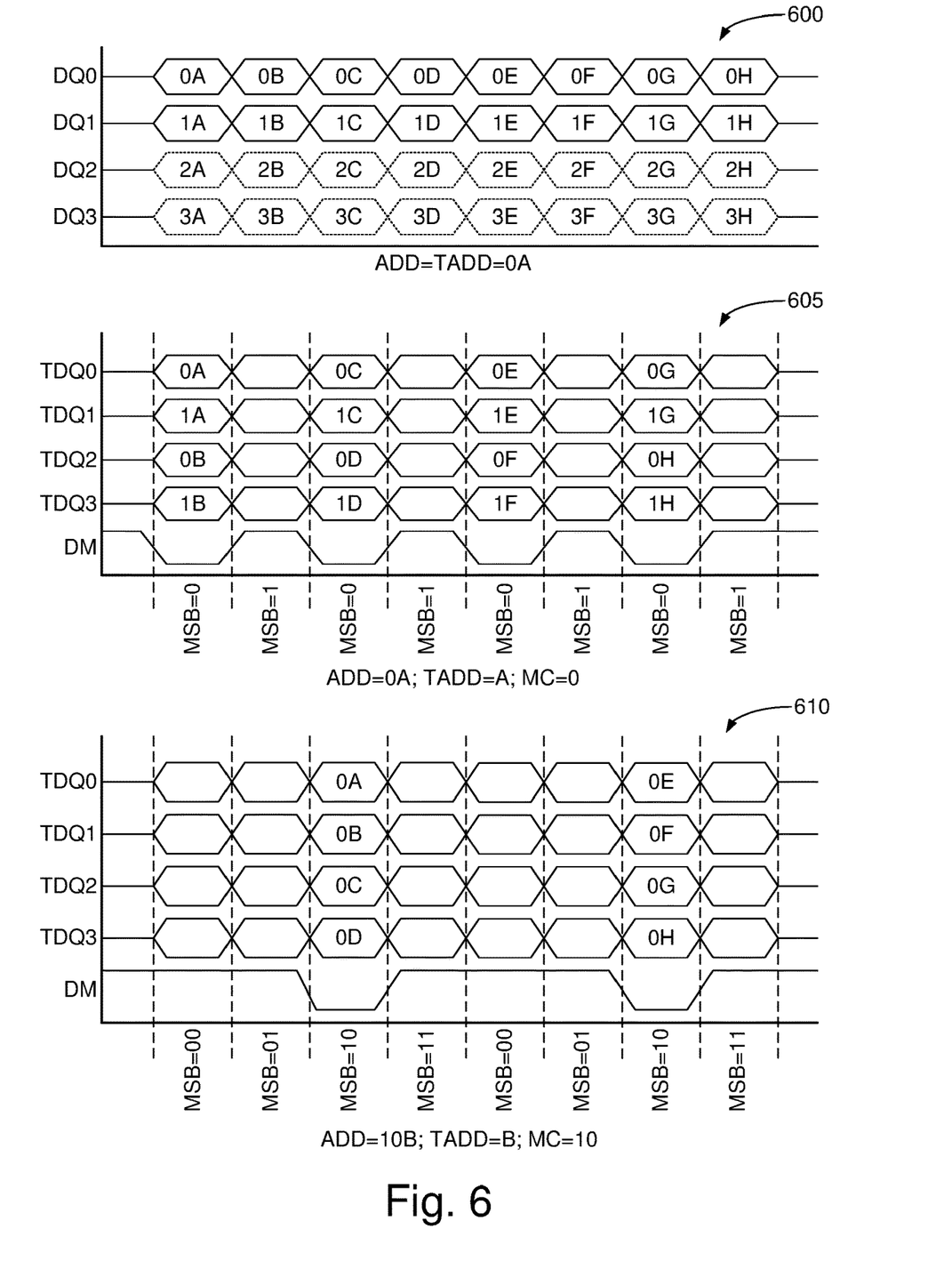
FIG. 6 includes three waveform diagrams 600, 605, and 610 depicting the operation of a memory module 200 in a dual-module memory topology of the type detailed in FIGS. 1 and 2 in which the data is presented to one of the modules on external data lines DQ0 and DQ1.

FIG. 6 includes a pair of waveform diagrams 600 and 605 depicting the operation of a memory module 200 in a dual-module memory topology of the type detailed in FIGS. 1A and 2. With reference to diagram 600, data is presented to one of two modules 200 on external data lines DQ0 and DQ1. The example assumes a burst length of eight symbols, so each of the depicted symbols is stored at the same address 0A, where "0" is the temporal address and "A" is the physical address. The burst length can be longer or shorter in other embodiments.

Turning to 605, the address space in the fixed-width memory is bisected in the time domain. One of the external address bits is employed to assert mask signal DM every other time slot. In this example, the MSB of the external address is zero, so mask signal DM is deasserted for every time slot MSB=0 to allow writes during those time slots.

FIG. 6 additionally includes a waveform diagram 610 depicting the operation of memory module 200 in a four-module memory topology supporting eight-symbol bursts. The address ADD is here assumed to be 10B for the eight symbols, where address bits B designate a physical address location and the remaining two bits 10 designate one of four temporal subsets of address locations within the designated physical address location B. Address translator 230 presents address bits B to memory 210 over address bus TAdd, and presents the temporal address bits (e.g., 10) to data translator 225 as memory control bits MC. Data translator 205 logically combines control bits MC to assert mask signal DM during three of the four time slots MSB=00 through MSB=11, only allowing a write to time slot MSB=10 in this case. The process repeats for the next four symbols of the eight-symbol burst.

Figure 7:
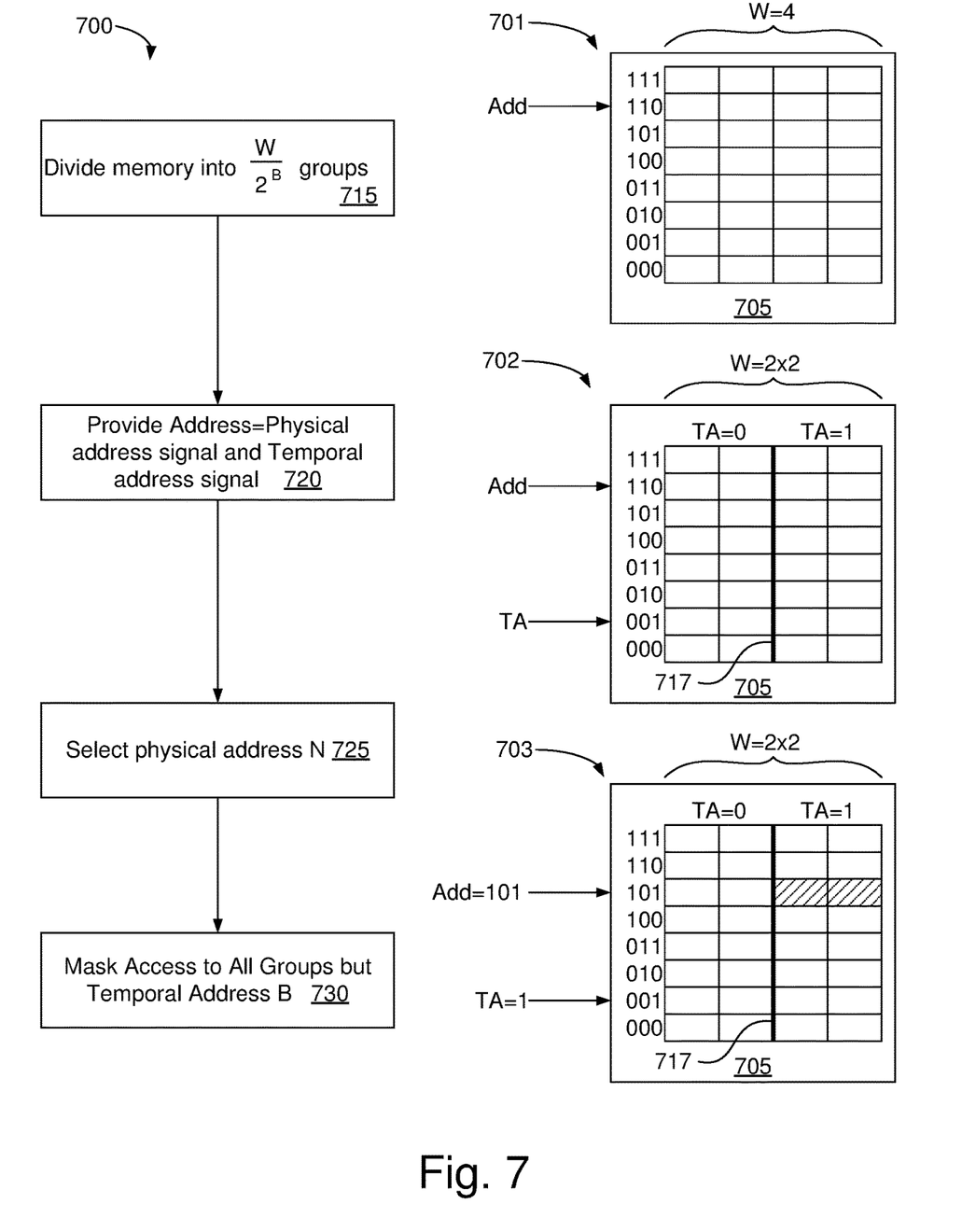
FIG. 7 includes a flowchart 700 and three representations of a fixed-width memory die 705 that together illustrate a method in accordance with one embodiment.

FIG. 7 employs a flowchart 700 and three representations 701, 702, and 703 of a fixed-width memory die 705 to illustrate a method in accordance with one embodiment. Memory die 705 has $2^N$ physical, four-bit memory locations, shown as rows 000 to 111, that can be uniquely addressed using address lines Add. In accordance with this embodiment, the four-bits associated with each memory location can be divided into two two-bit sets or four one-bit sets that are separately addressable. Memory die 705 can thus be configured as a 4×8, 2×16, or 1×32 memory. The following discussion illustrates an example in which memory 705 is configured as a 2×16 memory.

Beginning at step 715, each of the $2^N$ physical memory locations is divided into $2^B$ sub-locations. B is one in this example, so each physical memory location in memory 705 is divided into $2^1=2$ two-bit memory locations. The left and right columns of two-bit sub-locations, separated by a line 717, are respectively designated TA=0 and TA=1, where "TA" is for "Temporal Address." Though not shown here, B can be set to two to divide each physical memory location into four one-bit memory locations, and wider physical memories can be divided into larger numbers of subsets.

Next, in step 720, an address is provided to specify a physical address location and, using a one-bit temporal address, a two-bit sub-location. The subsets are termed "temporal" addresses because, as detailed above, they are separately accessed in the time domain. In this example, the number of addressable locations is doubled by dividing each physical location into two subsets, so one additional address bit is used to distinguish between the two subsets.

In step 725, the physical portion of the address of step 720 is employed to select one of the physical address locations. The specified physical address Add is 101 in this example. Finally, in step 730, the temporal address TA is set to one, masking access to the first two bits of row 101 and allowing access to the last two bits. The two bit positions highlighted in the lowermost instance of die 705 are thereby uniquely addressed when Add:TA=1011. The remaining two-bit sub-locations can likewise be uniquely addressed.

The foregoing discussion focuses on data writes, but the embodiments disclosed above can be used for reads as well by reversing the translation process. In one embodiment, for example, masked and unmasked subsets of data are read from fixed-width memory over an internal interface. The data-width translator then discards the masked data and translates the unmasked data to reverse the transposition employed for data writes. The resulting untransposed data is then presented on the external memory interface.

Variable Burst Order for Reduced Read Latency

Memory die in the foregoing examples convey data in bursts of four or eight symbols. Such die can introduce unnecessary access latency when any but the first data symbol or symbols is needed first. It may be, for example, that a read request is initiated to retrieve the last four symbols in an eight-symbol burst. If the eight symbols must be delivered in a fixed order, delivery of the required data would have to await delivery of the preceding four unrequested symbols. A requirement to deliver unrequested data in advance of requested data introduces undesirable read latency.

Some memory die address this latency problem by allowing the memory controller to specify the symbol order for a requested burst sequence. This feature is commonly referred to as "variable burst order." Returning to the preceding example, the die responding to the read request to retrieve the last four symbols in an eight-symbol burst can be instructed to reorder the burst such that the requested symbols are presented first. A modern double-date-rate memory architecture known as DDR2 SDRAM, for example, supports burst modes in which either four or eight-bit bursts can be reordered. The following embodiments utilize variable-burst ordering supported by e.g. DDR2 SDRAM to remove the read latency otherwise imposed by the temporal addressing schemes of the above-detailed embodiments.

Figure 8:
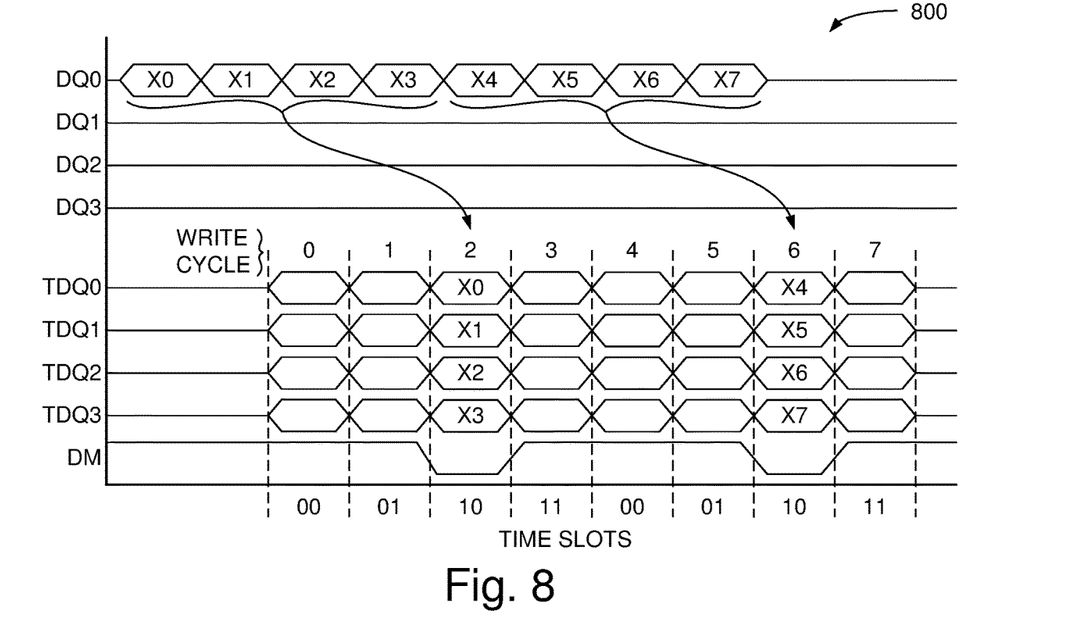
FIG. 8 is a waveform diagram 800 depicting the operation of a memory module in a four-module memory topology supporting eight-symbol bursts.

FIG. 8 is a waveform diagram 800 depicting the operation of a memory module in a four-module memory topology supporting eight-symbol bursts, and will be used to describe an embodiment in which variable burst ordering reduces read latency. In this example, data symbols are written to memory in two of eight write cycles 0-7. The write cycles are divided into two groups of four "time slots" 00, 01, 10, and 11. As in the preceding examples, the time slots represent temporal addresses. In this example, eight data symbols X0-X7 are written to two four-symbol time slots 10 in the same physical address location by masking writes to the remaining time slots.

In the example of FIG. 8, write access is blocked during the first two write cycles 0 and 1. The resulting two cycles of write latency can be accommodated with appropriate buffering, and so should not adversely impact memory-system performance. If the same ordering is employed to read back that data, however, the resulting two cycles of delay will introduce a two-cycle read latency that can adversely impact speed performance. Memory modules in accordance with some embodiments overcome this problem by reordering read bursts to reduce or cancel read latency.

Figure 9:
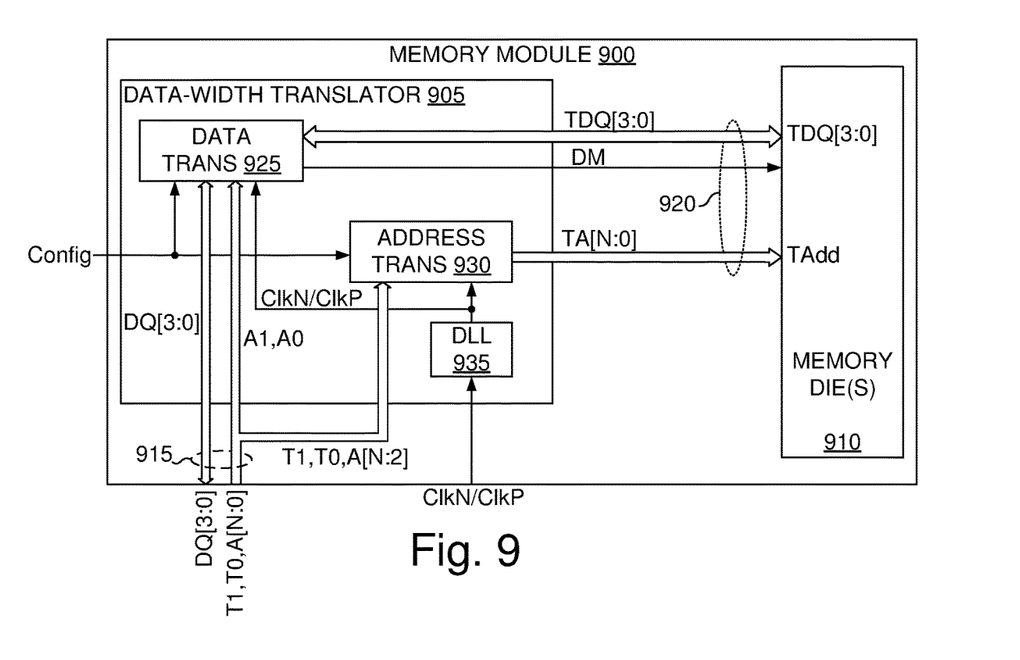
FIG. 9 schematically depicts a variable-width memory module 900 in accordance with an embodiment that reorders read bursts to reduce read latency.

FIG. 9 schematically depicts a variable-width memory module 900 in accordance with an embodiment that reorders read bursts to reduce read latency. Writes are performed in the manner detailed above in connection with module 200 of FIG. 2. Module 900 includes a data-width translator 905 coupled to at least one memory die 910 that supports variable burst orders. Memory module 900 includes external data and address ports DQ[3:0] and T1,T0,A[N:0] communicating like-named signals with a data-width translator 905 via an external memory interface 915. Memory die 910 includes internal data and address ports TDQ[3:0] and TA[N:0] communicating like-named signals with data-width translator 905 via an internal memory interface 920. Data ports DQ[3:0] and TDQ[3:0] are each four-bits wide in this simple illustration, but the actual bus width can have more or fewer bits. Data-width translator 905 can translate data of width one, two, or four on port DQ[3:0] to and from four-bit-wide data on port TDQ[3:0], and can further adjust the burst order from die 910 to reduce read latency.

Data-width translator 905 includes a data translator 925, an address translator 930, and a delay-locked loop (DLL) 935. DLL 935 conventionally produces an internal differential clock signal ClkN/ClkP locked to a like-identified incoming differential clock signal ClkN/ClkP, typically from an associated memory controller or a clock-generator device. Data translator 925 and address translator 930, responsive to a configuration signal Config, translate the data on one, two, or four of data lines DQ[3:0] into four-bit-wide data on lines TDQ[3:0] for write cycles; and conversely translate four-bit-wide data on lines TDQ[3:0] into one, two, or four-bit-wide data on one or more of external data lines DQ[3:0] for read cycles. In general, external memory interface 915 conveys data signals of data-width N, internal memory interface 920 conveys signals of data-width M, and configuration signal Config is one or more bits indicative of the ratio of N to M. Memory module 900 works substantially like module 200 of FIG. 2 to support variable data width using fixed-width memory die.

Memory die 910 is, in this embodiment, one or more DDR2 dies, which support variable burst ordering in the manner outlined in the following Table 1. The data of Table 1 is taken from page 23 of JEDEC Standard JESD790-2B for DDR2 SDRAM (January 2005). The following examples are specific to DDR2 memories, but this disclosure can be adapted to other memory technologies, as will be evident to those of skill in the art.

TABLE 1

Burst Sequences for Burst Length of Eight

| Burst Length | Starting Address TA[2:0] | Sequential Addressing (decimal) | Interleave Addressing (decimal) |
| --- | --- | --- | --- |
| 8 | 0 0 0 | 0, 1, 2, 3, 4, 5, 6, 7 | 0, 1, 2, 3, 4, 5, 6, 7 |
|   | 0 0 1 | 1, 2, 3, 0, 5, 6, 7, 4 | 1, 0, 3, 2, 5, 4, 7, 6 |
|   | 0 1 0 | 2, 3, 0, 1, 6, 7, 4, 5 | 2, 3, 0, 1, 6, 7, 4, 5 |
|   | 0 1 1 | 3, 0, 1, 2, 7, 4, 5, 6 | 3, 2, 1, 0, 7, 6, 5, 4 |
|   | 1 0 0 | 4, 5, 6, 7, 0, 1, 2, 3 | 4, 5, 6, 7, 0, 1, 2, 3 |
|   | 1 0 1 | 5, 6, 7, 4, 1, 2, 3, 0 | 5, 4, 7, 6, 1, 0, 3, 2 |
|   | 1 1 0 | 6, 7, 4, 5, 2, 3, 0, 1 | 6, 7, 4, 5, 2, 3, 0, 1 |
|   | 1 1 1 | 7, 4, 5, 6, 3, 0, 1, 2 | 7, 6, 5, 4, 3, 2, 1, 0 |

DDR2 memory can be programmed to provide sequential or interleaved bursts in the orders noted above in Table 1. In either mode, the three lowest-order address bits TA[2:0] to the DDR2 die are burst-order bits that can be set to select one of the eight data-read orders of Table 1. For example, if the third symbol (symbol "2") is to be read first over the internal data bus, burst-order bits TA[2:0] of the internal address bus can be set to 010 to select the data-read order that delivers that symbol first over internal data port TDQ[3:0]. The first symbol is the same for sequential or interleaved bursts are selected.

Figure 10:
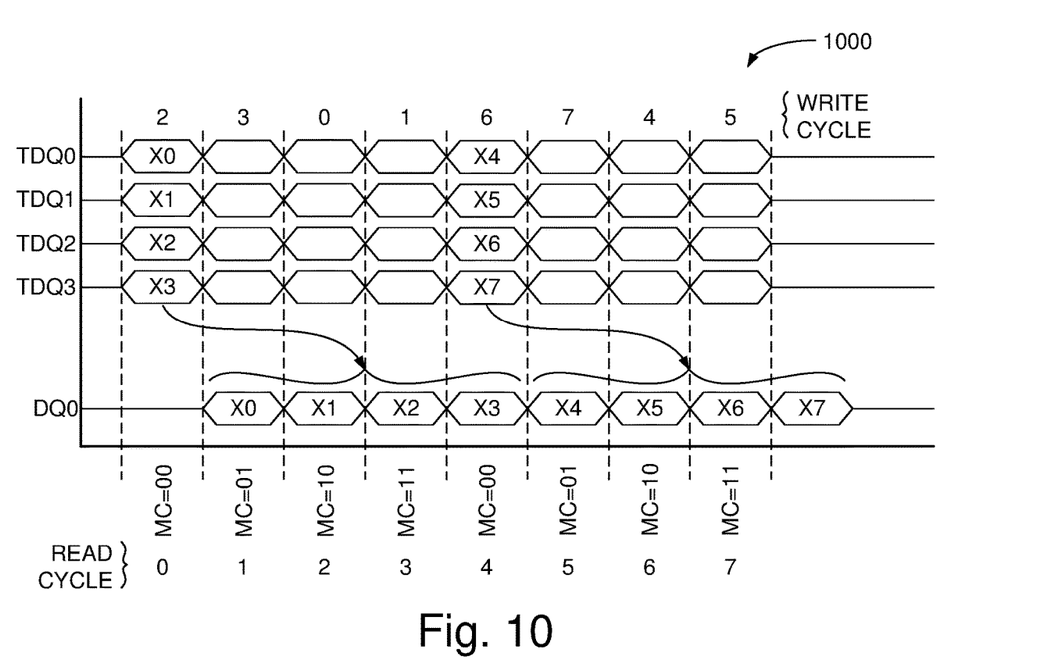
FIG. 10 is a waveform diagram 1000 depicting how address translator 930 reorders a read access to reduce read latency.

FIG. 10 is a waveform diagram 1000 depicting how address translator 930 reorders a read access to reduce read latency. Data symbols X0-X7 are assumed for this example to be the same symbols stored in the write access of FIG. 8 in write cycles 2 and 6 (both time slots 10). In FIG. 10, the read burst has been reordered to present the symbols of write cycles 2 and 6 first, making symbols X0-X3 immediately available. Both time slots 10 are advanced two clock cycles, so symbols X0-X7 can be read from die 910 and serialized with minimal delay. Knowing that the requested data will be presented on the first and fifth read cycles 0 and 4, respectively, address translator 930 ignores or discards data presented on the remaining clock cycles.

The following Table 2 summarizes the logic of address translator 930 when module 900 is operating in an eight-symbol-burst mode. The example of FIG. 10 is consistent with the row in which external address bits T1 and T0 are respectively 1 and 0, in which case the requested data was originally written in write cycles 2 and 6 and is consequently stored in time slots 10. To reduce read latency, the temporal address bits T1 and T0 are evaluated to identify the time slots in which the desired data is stored and the read burst is reordered to present that data first. In the example of FIG. 10, address translator 930 sets internal address bits TA[2:0] to 010 such that die 910 returns the data of write-cycles 2 and 6 on read cycles 0 and 4, respectively. More generally, address translator 930 reorders all requested data as needed to present the data on the first and fifth read cycles 0 and 4, which correspond to the two time slots 00 in a given eight-symbol burst. Because all addressed data is presented during the first and fifth read cycles, data translator 925 ignores or deletes the symbols associated with the other read cycles.

TABLE 2

Read Logic of Address Translator 930

| External Address | | Internal Addressing | | Unmasked | |
|---|---|---|---|---|---|
| T1, T0 | Write Cycles | Slots | TA2, TA1, TA0 | Read Cycles | MC |
| 0 0 | 0, 4 | 0 0 | 0 0 0 | 0, 4 | 0 0 |
| 0 1 | 1, 5 | 0 1 | 0 0 1 | 0, 4 | 0 0 |
| 1 0 | 2, 6 | 1 0 | 0 1 0 | 0, 4 | 0 0 |
| 1 1 | 3, 7 | 1 1 | 0 1 1 | 0, 4 | 0 0 |

In addition to reordering read symbols for reduced latency, memory module 900 supports burst reordering requested externally (e.g., via the memory controller) in conformance with the above-mentioned JEDEC Standard. That is, memory module 900 can reorder a read-addressed burst to present that requested burst in any of the orders specified in Table 1 above. In the support of this functionality, address translator 930 considers address bit A2, one of the three low-order address bits used to specify burst reordering per the JEDEC Standard: data translator 925 considers the remaining two low-order bits A1 and A0. The three burst-order bits of the external address bus support as many as eight requested burst orders in a given configuration, other embodiments may support more or fewer.

To reduce read latency in accordance with the foregoing embodiment, address translator 930 directs die 910 to present data in read cycles zero and four as two four-symbol groups. In the example of FIG. 10, address translator 930 directs die 910 to present symbols X[0:3] in read cycle 0 and symbols X[4:7] in read cycle 4. Die 910 supports reordering, however, and is capable of reversing this order to present symbols X[4:7] in read cycle 0 and X[0:3] in read cycle 4. Only one of the reorder address bits, bit A2, is required to distinguish between these two possibilities. Address translator thus considers address bit A2 to determine which four-symbol group to present first. Table 3 presents the data of Table 2 extended to support externally requested burst reordering of read data. The logic of Table 3 considers external address bit A2 to determine whether to reverse the read order of data written over two specified write cycles.

TABLE 3

Read Logic of Address Translator 930

| External Address | Internal Address | | Unmasked | |
|---|---|---|---|---|
| T1, T0, A2 | Write Cycles | TA2, TA1, TA0 | Read Cycles | MC |
| 0 0 0 | 0, 4 | 0 0 0 | 0, 4 | 0 0 |
| 0 0 1 | 4, 0 | 1 0 0 | 0, 4 | 0 0 |
| 0 1 0 | 1, 5 | 0 0 1 | 0, 4 | 0 0 |
| 0 1 1 | 5, 1 | 1 0 1 | 0, 4 | 0 0 |
| 1 0 0 | 2, 6 | 0 1 0 | 0, 4 | 0 0 |
| 1 0 1 | 6, 2 | 1 1 0 | 0, 4 | 0 0 |
| 1 1 0 | 3, 7 | 0 1 1 | 0, 4 | 0 0 |
| 1 1 1 | 7, 3 | 1 1 1 | 0, 4 | 0 0 |

Using the logic of Table 3, address translator 930 can direct die 910 to convey two four-symbol groups, e.g. X[0:3] and X[4:7], to data translator 925 in either order. It is then up to data translator 925 to determine the order in which the individual symbols in these four-symbol groups are conveyed via external bus 915. The following Table 4 illustrates the logic data translator 925 employs in one embodiment.

TABLE 4

Read Logic for Data Translator 925

| Address Bits A1, A0 | Sequential Addressing TDQ[0:3] | | Interleave Addressing TDQ[0:3] | |
|---|---|---|---|---|
| 0 0 | 0, 1, 2, 3 | 0, 1, 2, 3 | 0, 1, 2, 3 | 0, 1, 2, 3 |
| 0 1 | 1, 2, 3, 0 | 1, 2, 3, 0 | 1, 0, 3, 2 | 1, 0, 3, 2 |
| 1 0 | 2, 3, 0, 1 | 2, 3, 0, 1 | 2, 3, 0, 1 | 2, 3, 0, 1 |
| 1 1 | 3, 0, 1, 2 | 3, 0, 1, 2 | 3, 2, 1, 0 | 3, 2, 1, 0 |

The first column of Table 4 lists the four possible combinations of external address bits A1 and A0. The second column shows the order data translator 925 issues symbols received on bus TDQ[3:0] responsive to address bits A1 and A0 when module 900 is operating in an addressing scheme that allows sequential reordering of data bursts. The third column shows the order data translator 925 issues symbols received on bus TDQ[3:0] responsive to address bits A1 and A0 when module 900 is operating in an addressing scheme that allows interleaved reordering of data bursts.

Assume, for example, that all of the address bits A[2:0] that specify burst order are zero (i.e., A[2:0]=000). Per Table 1, the burst data should be returned in the order stored. Address translator 930 thus instructs die 910 to present the requested data in the order that data was originally written. In the example of FIG. 10, data translator 925 would receive symbols X[0:3] before symbols X[4:7]. Per the logic of Table 4, and given that address bits A1 and A0 are both zero in this example, translator 925 will successively serialize the symbols in each group according to the bus line upon which each symbol is conveyed from die 910 (i.e., TDQ0, TDQ1, TDQ2, and TDQ3). The result, for both sequential and interleave modes, is that the symbols in each four-symbol group are presented in the order originally written (i.e., the symbols are not reordered).

Figure 11:
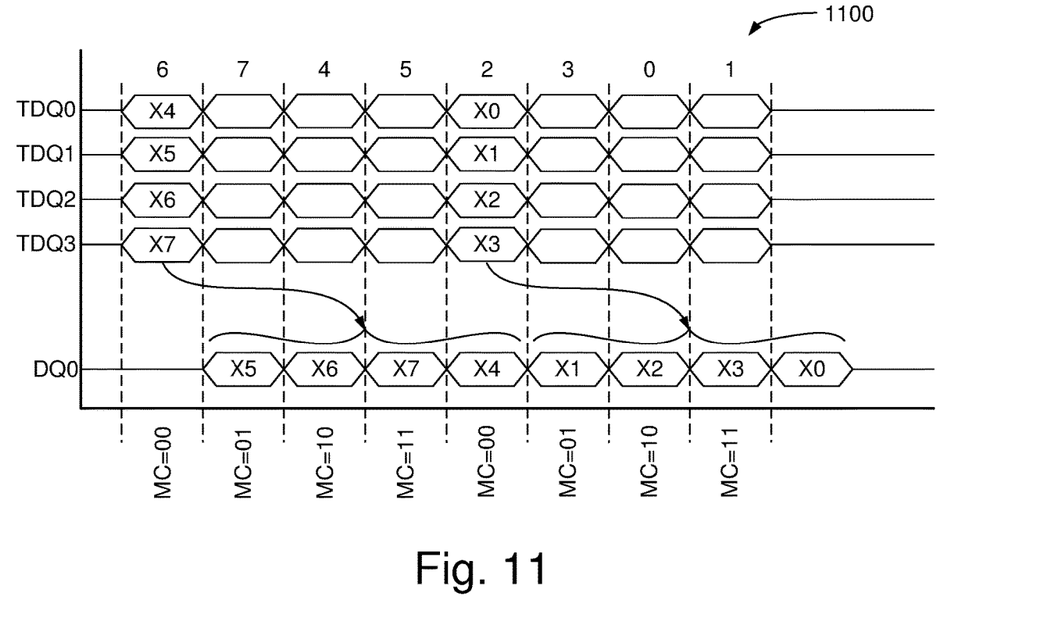
FIG. 11 is a waveform diagram 1100 illustrating an example in which external address bits T1, T0, A2, A1, and A0 are set to 10101 during a read access in which module 900 is operating in the sequential mode.

FIG. 11 is a waveform diagram 1100 illustrating an example in which external address bits T1, T0, A2, A1, and A0 are set to 10101 during a read access in which module 900 is operating in the sequential mode. The remaining address bits refer to a physical address location in die 910, and may be ignored in this example.

T1 and T0, being one and zero respectively, specify a temporal address associated with write-cycle two. Per Table 1 and assuming the sequential mode, the remaining three bits 101 specify that the data is to be read in the following order: 5, 6, 7, 4, 1, 2, 3, 0. In the present example, this means module 900 should present symbols X[0:7] sequentially as X5, X6, X7, X4, X1, X2, X3, X0.

The fact that address bit A2 of the example is a logic one indicates that the first data symbol sought is a member of the second four-bit group of symbols, X[4:7]. Address translator 930 conveys address bit A2 on internal line TA2 and logic zeroes on lines TA1 and TA0. Die 910 responds by presenting symbols X[4:7] first and X[0:3] second on buses TDQ[0:3]. Turning to Table 1, this response is appropriate for the reordering specified by the JEDEC Standard for DDR2 memory: the last four symbols in an eight-symbol burst are provided first when address line A2 is a logic one.

Address bits A1 and A0 of the example are zero and one, respectively, so the first data symbol sought is the sixth, symbol X5 in the example of FIG. 11. As shown for data line DQ0 in FIG. 11, data translator 925 thus reorders the first set of symbols received from die 905 to present symbol X5 first. If module 900 is in the sequential mode, address translator 925 reorders the first four bits of data as X5, X6, X7, X4, and likewise reorders the second four bits of data as X1, X2, X3, and X0. Though not shown, if in the interleaved mode, the eight bits of data would be reordered as X5, X4, X7, X6, X1, X0, X3, and X2.

Reordering, as explained above, can be used internally to reduce read latency, or can be specified externally at the request of e.g. the memory controller for both read and write access. In accordance with the JEDEC Standard referenced above, the manner of reordering, either sequential or interleaved, is programmable and defined by external address bit A3, which may be conveyed to die 905 via address translator 930. Other embodiments support more or different burst lengths, reordering schemes, or both.

Data width translator 905 can be adapted to support different burst lengths. One such embodiment is configurable to support both sequential and interleaved addressing schemes for burst lengths of four or eight. Table 4, below, shows the operation specified for DDR2 memories in the above-referenced JEDEC Specification, which is supported by module 900 in one embodiment.

TABLE 5

Burst Sequences for Burst Length of Four

| Burst Length | Starting Address (A1, A0) | Sequential Addressing (decimal) | Interleave Addressing (decimal) |
|---|---|---|---|
| 4 | 0 0 | 0, 1, 2, 3 | 0, 1, 2, 3 |
|   | 0 1 | 1, 2, 3, 0 | 1, 0, 3, 2 |
|   | 1 0 | 2, 3, 0, 1 | 2, 3, 0, 1 |
|   | 1 1 | 3, 0, 1, 2 | 3, 2, 1, 0 |

Address line A2 is not used when the burst length is set to four because there are only four supported ordering schemes. Address translator 930 reorders data retrieval to reduce latency in the manner detailed above, while data translator 925 reorders each four-symbol burst received via bus TDQ[3:0] in the manner defined by Table 5. Table 5 expresses the same logic as Table 4, and is consistent with the above-reference JEDEC Standard.

Memory module 900 has been described in as a one-bit-wide module that is assumed to be one of four modules in a four-bit-wide memory system. Embodiments of module 900 can be of variable width to work e.g. as two or four-bit modules in the manner detailed above in connection with module 200 of FIG. 2. In DDR2-compatible embodiments the logic employed by address translator 930 and data translator 925 supports the functionality expressed in Tables 1 and 4, supra. Burst reordering for reduced latency can be supported in any all or a subset of available data widths.

In the foregoing description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. With respect to terminology, a signal is said to be "asserted" when the signal is driven to a low or high logic state (or charged to a high logic state or discharged to a low logic state) to indicate a particular condition. Conversely, a signal is said to be "de-asserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or de-asserts, if explicitly stated or indicated by context) the signal on a signal line coupled between the signal driving and signal receiving circuits.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

While the present invention has been described in connection with specific embodiments, variations of these embodiments will be obvious to those of ordinary skill in the art. For example:

1. The concepts detailed above can be extended to any combination of external and internal data widths, and embodiments can be adapted for use with multi-PAM signaling schemes.
2. Memory die could be adapted to support a second mask signal for memory time slicing in the manner discussed above.
3. Memory die in accordance with some embodiments can be soldered directly to a board and either permanently or programmably configured to a particular width. Such arrangements, particularly for systems in package (SIP) embodiments, facilitate the creation of single packaged components configured as any of several data widths.
4. Data-width translation logic can be incorporated into a buffer shared among multiple memory die on a module, or may be distributed throughout multiple smaller buffers that each support one or a subset of memory die on a module.
5. Mask signals dedicated for time sharing physical address locations can be used instead of the data-mask signals currently available with some memory die.
6. Data-width translation logic can be provided on the motherboard, and possibly integrated with a memory controller, instead of included on the module with the fixed-width die.

Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. § 112.

What is claimed is:

1. A data-width translator comprising:
an address port to receive address signals designating physical addresses and temporal addresses, wherein the temporal addresses are separately accessed in a time domain;
a first data port to receive data of a first data width and accompanied by the address signals; and
a second data port to transmit the data at a second data width wider than the first data width,
the data-width translator to transmit the data over the second data port at the second data width to the temporal addresses in a write-burst order and receive the data over the second data port at the second data width from the temporal addresses in a read-burst order different from the write-burst order.

2. The data-width translator of claim 1, the data-width translator to determine the read-burst order from the address signals.

3. The data-width translator of claim 2, the data-width translator to determine the read-burst order from the address signals designating the temporal addresses.

4. A data-width translator comprising:
an address port to receive address signals designating physical addresses and temporal addresses;
a first data port to receive data of a first data width and accompanied by the address signals; and
a second data port to transmit the data at a second data width wider than the first data width,
the data-width translator to transmit the data over the second data port at the second data width to the temporal addresses in a write-burst order and receive the data over the second data port at the second data width from the temporal address in a read-burst order different from the write-burst order and to selectively assert a mask signal responsive to the address signals designating the temporal addresses.

5. The data-width translator of claim 4, the mask signal timed to time slots arranged in the write-burst order, the time slots including a first time slot and a last time slot.

6. The data-width translator of claim 5, wherein the write-burst order asserts the mask signal timed to the first time slot in writing the data and the read-burst order reads that data timed to the first time slot.

7. The data-width translator of claim 1, further comprising an address translator to translate the temporal addresses into data-mask signals.

8. A memory module comprising:
an external memory interface supporting a first data width and including an external address port;
a memory die having a plurality of physical address locations and a data port supporting a second data width wider than the first data width; and
a data-width translator coupled between the external memory interface and the memory die, the data-width translator writing data of the second data width over the data port to one of the physical address locations in a write-burst order and reading the data of the second data width from the one of the physical address locations in a read-burst order different from the write-burst order;
the data-width translator further comprising a data-mask port, the data-width translator to assert a data-mask signal on the data-mask port responsive to first address signals on the external address port.

9. The memory module of claim 8, the data-width translator further asserting second address signals to the memory die responsive to the first address signals.

10. The memory module of claim 8, the data-width translator to determine the read-burst order from address signals on the external address port.

11. The memory module of claim 10, the data-width translator further translating the address signals on the external address port to physical addresses indicating ones of the physical address locations.

12. The memory module of claim 8, the data-width translator to selectively assert a mask signal responsive to address signals on the external address port and designating temporal addresses in the memory die.

13. The memory module of claim 12, the mask signal timed to time slots arranged in the write-burst order, the time slots including a first time slot and a last time slot.

14. The memory module of claim 13, wherein the write-burst order asserts the mask signal timed to the first time slot in writing the data and the read-burst order reads that data timed to the first time slot.

* * * * *